United States Patent
Yeh

(10) Patent No.: US 9,876,052 B2
(45) Date of Patent: Jan. 23, 2018

(54) LIGHT-EMITTING DIODE DEVICE

(71) Applicant: EPISTAR CORPORATION, Hsinchu (TW)

(72) Inventor: Hui-Chun Yeh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 448 days.

(21) Appl. No.: 14/553,446

(22) Filed: Nov. 25, 2014

(65) Prior Publication Data
US 2015/0146426 A1    May 28, 2015

(30) Foreign Application Priority Data
Nov. 25, 2013  (TW) .............................. 102142931 A

(51) Int. Cl.
| | | |
|---|---|---|
| *H01L 33/00* | (2010.01) | |
| *H01L 27/15* | (2006.01) | |
| *H01L 25/075* | (2006.01) | |
| *H01L 33/08* | (2010.01) | |

(Continued)

(52) U.S. Cl.
CPC ........ *H01L 27/156* (2013.01); *H01L 25/0753* (2013.01); *H01L 33/08* (2013.01); *H01L 33/38* (2013.01); *H01L 33/62* (2013.01); *H01L 2224/18* (2013.01); *H01L 2224/32225* (2013.01); *H01L 2224/48091* (2013.01);

(Continued)

(58) Field of Classification Search
CPC ...... H01L 33/62; H01L 25/0753; H01L 33/08
See application file for complete search history.

(56) References Cited

U.S. PATENT DOCUMENTS

| | | | |
|---|---|---|---|
| 8,054,002 B2 | 11/2011 | Lee et al. | |
| 2011/0222285 A1* | 9/2011 | Ye ...................... | H05B 33/0821 362/249.02 |
| 2013/0299853 A1 | 11/2013 | Chen et al. | |

(Continued)

*Primary Examiner* — Ngan Ngo
(74) *Attorney, Agent, or Firm* — Muncy, Geissler, Olds & Lowe, P.C.

(57) ABSTRACT

A light-emitting diode device includes a substrate; a plurality of light-emitting units formed on the substrate, wherein the light-emitting units form a serially-connected array, including n adjacent light-emitting unit rows, wherein $n \geq 5$, and the light-emitting units in the same rows connect vertically and/or the light-emitting units in the same columns connect horizontally, and a connecting direction of at least three light-emitting units in two adjacent rows are the same; a plurality of conductive connecting structures connecting the plurality of light-emitting units; a first contact light-emitting unit formed on the substrate and in the first light-emitting unit row; and a second contact light-emitting unit formed on the substrate and in the $n^{th}$ light-emitting unit row; at least three light-emitting units in the first light-emitting unit row have a $1^{st}$ area, and at least three light-emitting units in the $n^{th}$ light-emitting unit row have a $2^{nd}$ area, wherein the $1^{st}$ area and the $2^{nd}$ area are not equal.

9 Claims, 13 Drawing Sheets

(51) Int. Cl.
*H01L 33/38* (2010.01)
*H01L 33/62* (2010.01)
(52) U.S. Cl.
CPC ............... *H01L 2224/48227* (2013.01); *H01L 2224/49107* (2013.01); *H01L 2224/73265* (2013.01)

(56) References Cited

U.S. PATENT DOCUMENTS

2014/0292622 A1* 10/2014 Lee .................. G09G 3/3233
345/80
2015/0331290 A1* 11/2015 Jung ................ G02F 1/134309
349/38

* cited by examiner

LIGHT-EMITTING DIODE DEVICE

CROSS-REFERENCE TO RELATED APPLICATIONS

This application claims priority to and the benefit of Taiwan Application Serial Number 102142931 filed on Nov. 25, 2013, which is incorporated by reference in its entirety.

BACKGROUND

Technical Field

The present disclosure relates to a light-emitting diode device, more particularly, to a light-emitting diode array device with high light extraction.

Description of the Related Art

Lighting principle and structure of the light-emitting diode (LED) are different from the conventional light. The LED has advantages of low power consumption, long lifetime, no warm-up time, and fast response. Besides, LED can be very small, has good shock resistance, and is suitable for mass-production so it can easily meet application demand and can be manufactured into a small device or an array device. The applications of the LEDs in the market are extensive, such as optical display device, laser diode, traffic light, data storage device, communication device, lighting device and medical device.

Conventional high voltage light-emitting diode device 1 is shown in FIG. 1A and FIG. 1B. The high voltage light-emitting diode device 1 comprises a transparent substrate 10 and a plurality of light-emitting units 12 extending in 2-dimensional direction and closely arranged and formed on the transparent substrate 10. An epitaxy stack 120 of each light-emitting unit 12 comprises a first semiconductor layer 121, an active layer 122, and a second semiconductor layer 123. Since the transparent substrate 10 is not conductive, trenches 14 formed between the plurality of epitaxy stacks 120 isolate each light-emitting unit 12. In addition, a portion of the epitaxy stacks 120 of the plurality of light-emitting units are etched to the first semiconductor layers 121 to form partial exposed areas. Next, conductive connecting structures 19 are formed on the second semiconductor layers 123 and the exposed areas of the first semiconductor layers 121 in adjacent light-emitting units. The conductive connecting structure 19 comprises a first electrode 18 and a second electrode 16. The first electrode 18 and the second electrode 16 comprise a first extending part 180 and a second extending part 160 respectively formed on the first semiconductor layer 121 and the second semiconductor layer 123 of the adjacent light-emitting units. The extending parts help current to uniformly flow into the semiconductor layers. The plurality of light-emitting units 12 forms an electric serial circuit or an electric parallel circuit by the conductive connecting structures 19 selectively formed on the first semiconductor layer 121 and the second semiconductor layer 123 of the adjacent light-emitting units 12. Under the conductive connecting structures 19 can be air, and an insulator 13 can also be formed on a part of an upper surface of the epitaxy stack and between the epitaxy stacks of the adjacent light-emitting units 12 by CVD or PVD. The insulator 13 serves as a protection of the epitaxy stack and an electrical isolation between the adjacent light-emitting units 12. The material of the insulator 13 is preferably $Al_2O_3$, $SiO_2$, AlN, $SiN_x$, $TiO_2$, $Ta_2O_5$ or combination of the materials described above.

While electrically connecting the light-emitting units 12 by the conductive connecting structures 19, since the elevation difference of the trench 14 is large, the conductive connecting structures 19 may be broken or have poor connection thereby to affect the yield of the device.

Besides, the light-emitting diode device 1 can be connected to and combined with other components to construct a light-emitting device. FIG. 2 shows a conventional art of a light-emitting device. As shown in FIG. 2, the light-emitting device 1 includes a submount 110 comprising a circuit 101 to carry the light-emitting diode device 1 described above, an electrical connection 104 to electrically connect a first electrode pad 16', a second electrode pad 18' of the light-emitting diode device 1 and the circuit 101 on the submount 110. The submount 110 can be a lead frame or a large mounting substrate to facilitate the design of the circuit and improve the heat dissipating. The electrical connection 104 can be a bonding wire or other connecting structures.

SUMMARY OF THE DISCLOSURE

A light-emitting diode device includes a substrate having a first surface; a plurality of light-emitting units formed on the first surface, wherein the light-emitting units form a serially-connected array, and the array includes a plurality of adjacent light-emitting unit rows and adjacent light-emitting unit columns, wherein the light-emitting unit row and the light-emitting unit column include at least three light-emitting units, the light-emitting units in the plurality of adjacent light-emitting unit rows and adjacent light-emitting unit columns are connected vertically or horizontally; a plurality of conductive connecting structures connecting the plurality of light-emitting units; and at least three light-emitting units in two of the adjacent light-emitting unit rows having the same connecting direction, and the connection of the light-emitting units of one row in at least two adjacent rows and the light emitting units in the adjacent row comprise one vertical connection and two horizontal connections.

A light-emitting diode device includes a substrate having a first surface; a plurality of light-emitting units formed on the first surface, wherein the light-emitting units form a serially-connected array, and the array comprises n adjacent light-emitting unit rows, wherein n≤5, and the light-emitting units in the same rows connect vertically and/or the light-emitting units in the same columns connect horizontally, and a connecting direction of at least three light-emitting units in two adjacent rows are the same; a plurality of conductive connecting structures connecting the plurality of light-emitting units; a first contact light-emitting unit formed on the first surface and in the first light-emitting unit row, and a first electrode pad formed on the first contact light-emitting unit; and a second contact light-emitting unit formed on the first surface and in the $n^{th}$ light-emitting unit row, and a second electrode pad formed on the second contact light-emitting unit; wherein at least three light-emitting units in the first light-emitting unit row have a first area, and at least three light-emitting units in the $n^{th}$ light-emitting unit row have a second area, wherein the first area and the second area are not equal.

A light-emitting diode device includes a substrate having a first surface; a plurality of light-emitting units including four edges respectively, formed on the first surface, wherein the light-emitting units form a serially-connected array, and the array includes at least three adjacent rows; and a plurality of conductive connecting structures connecting the plurality of light-emitting units, wherein the two conductive connecting structures of one light-emitting unit are formed on the same edge of the light-emitting unit, and the light-emitting unit which has two conductive connecting structures formed on the same edge crosses two adjacent rows.

DETAILED DESCRIPTION OF THE EMBODIMENTS

The present disclosure discloses a light-emitting diode. To better and concisely explain the disclosure, please refer to the following description and FIG. 3A~FIG. 6.

Embodiments of the present disclosure will be described in detail with reference to the accompanying drawings. The size of the light-emitting diode device gradually becomes smaller as the market demand increases. While the area of each light-emitting unit of the LED device becomes smaller, the opaque structures on the light-emitting surface, such as the electrodes, the electrode extending parts, and the conductive connection structures greatly affect the light extraction efficiency of the light-emitting units.

Figure 1A:
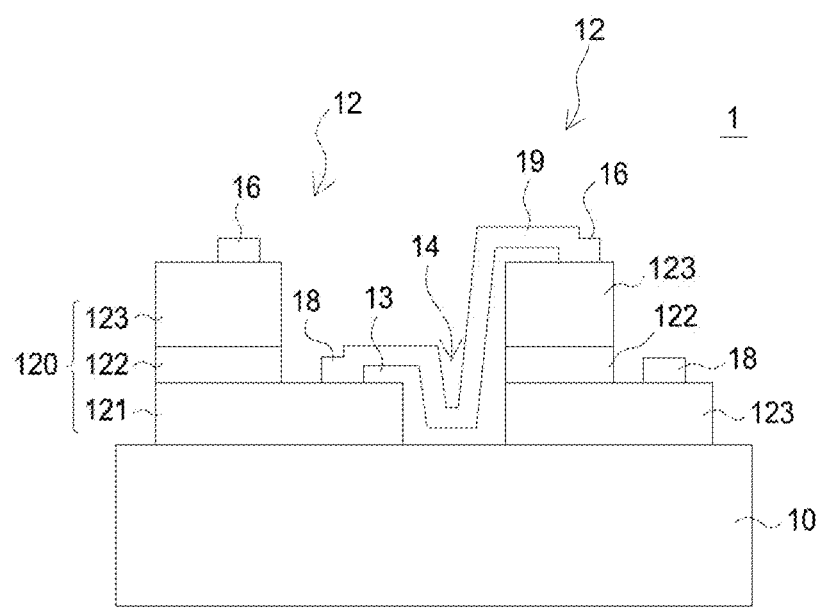
FIG. 1A shows a cross-sectional view of a conventional light-emitting diode array device.
Figure 1B:
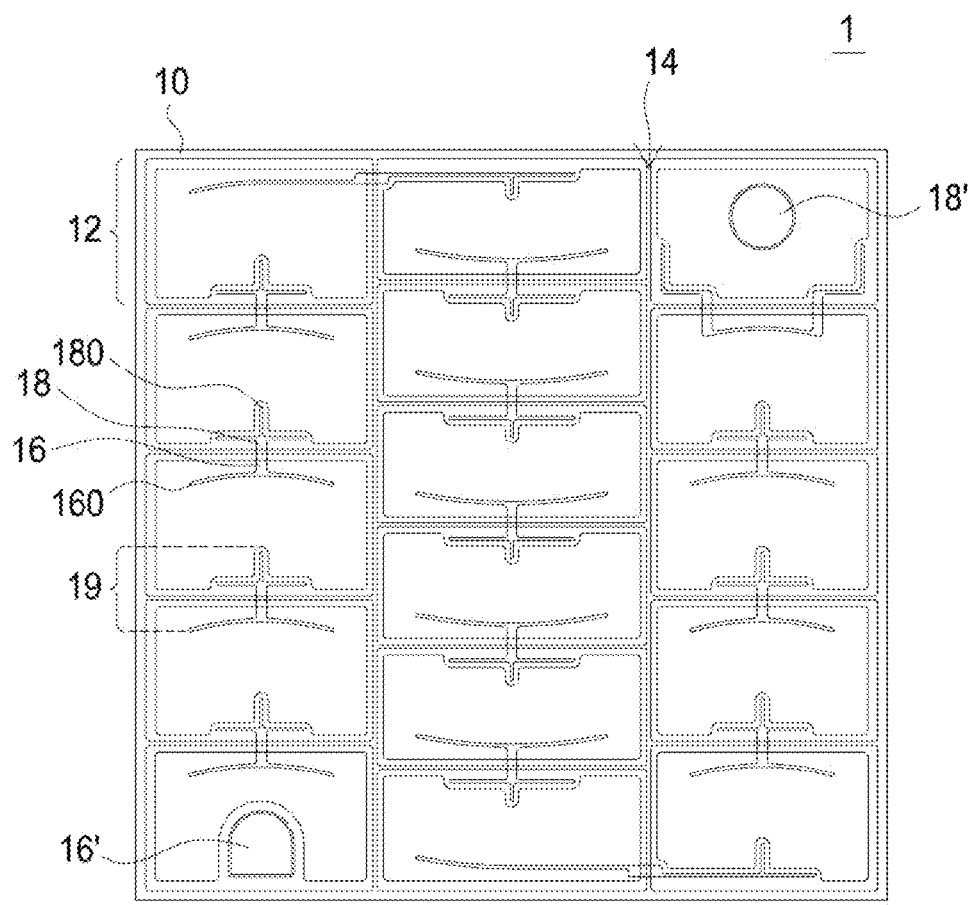
FIG. 1B shows a top view of a conventional light-emitting diode array device.
Figure 2:
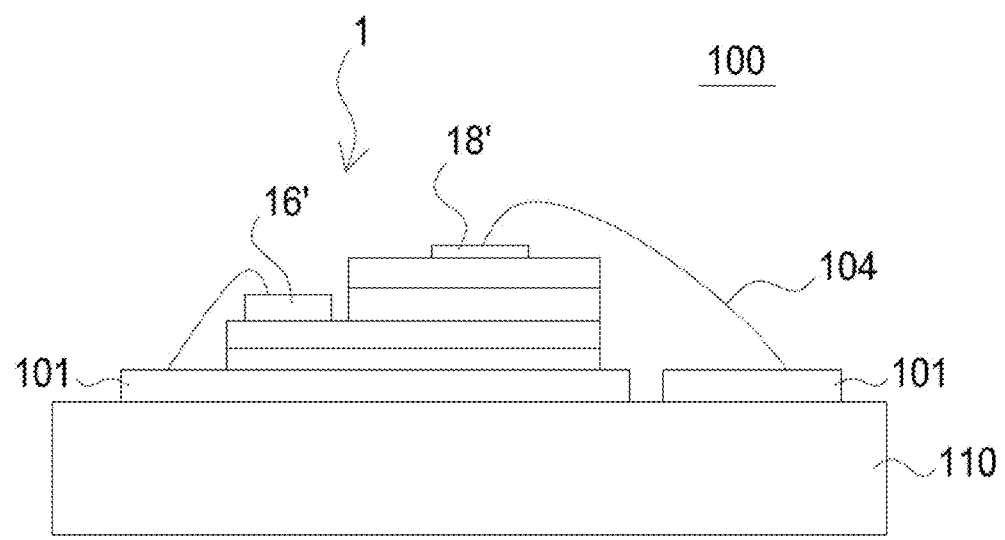
FIG. 2 shows a conventional light-emitting device.
Figure 3A:
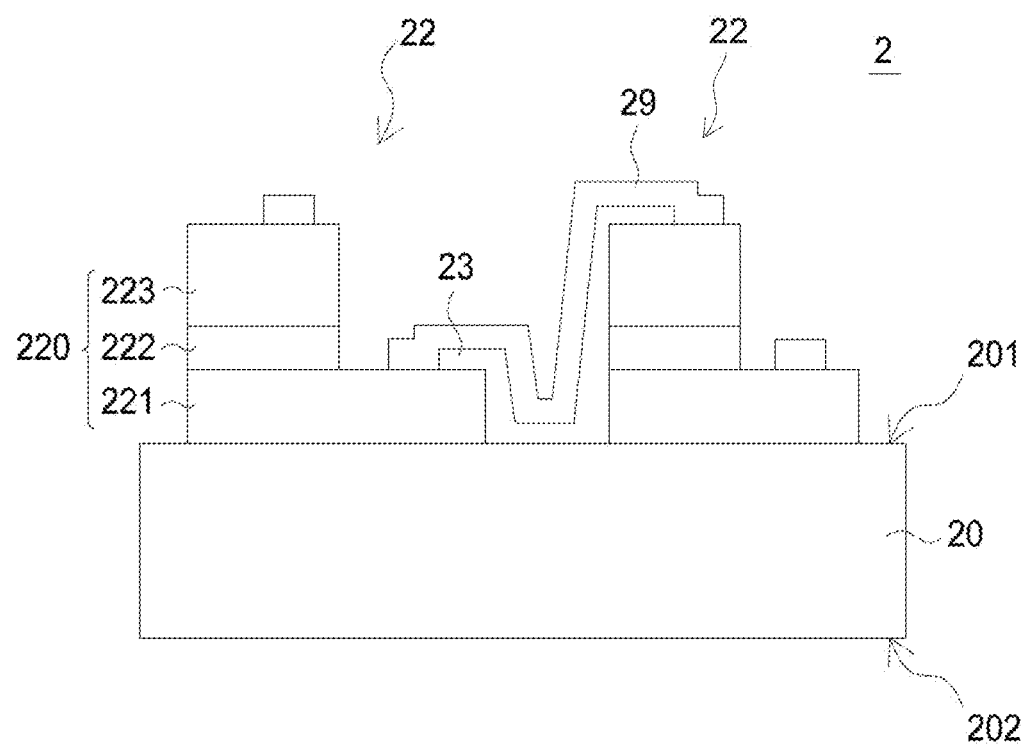
FIG. 3A shows a cross-sectional view of the light-emitting unit in accordance with one embodiment of present disclosure.
Figure 3B:
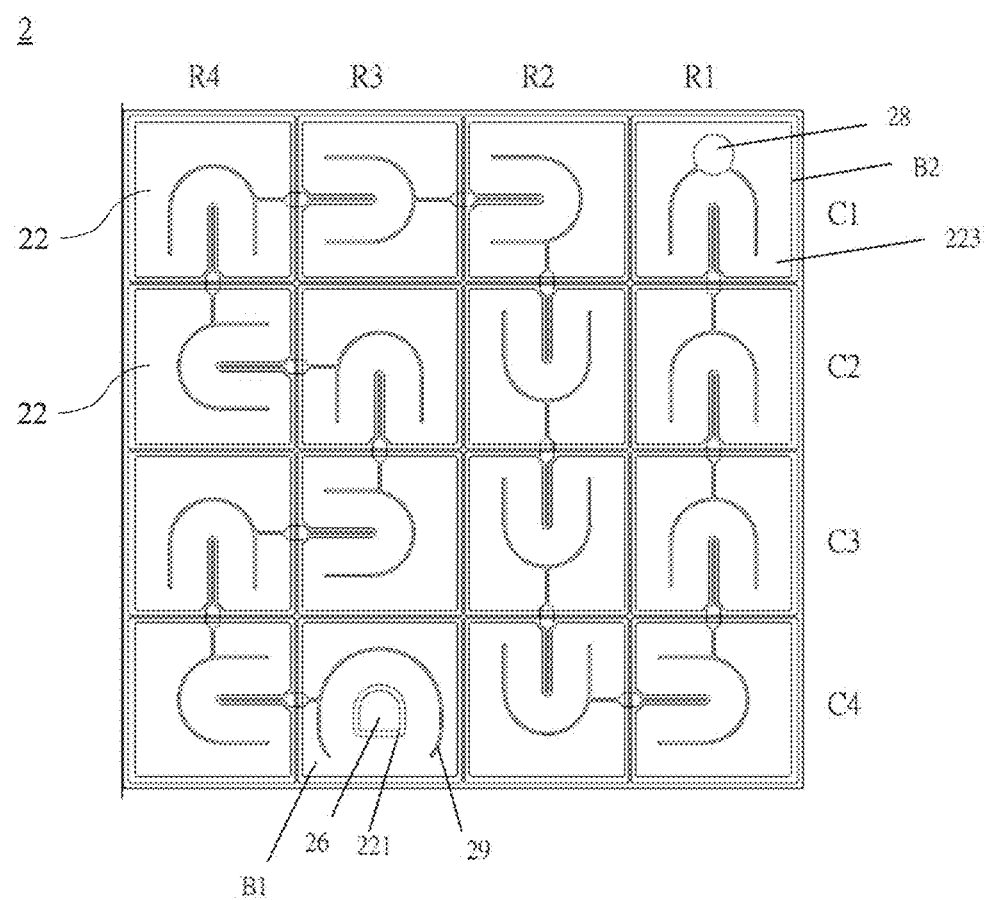
FIGS. 3B~3G show top views of the light-emitting diode device in accordance with one embodiment of present disclosure.

FIG. 3A and FIG. 3B show a cross-sectional view and a top view of a light-emitting diode array device 2 in accordance to the first embodiment of the present disclosure. The light-emitting diode array device 2 comprises a substrate 20 having a first surface 201 and a second surface 202 opposite to the first surface 201. In this embodiment, the material of the substrate 20 is sapphire. The substrate 20 is not limited to a single material and can be a composite substrate composed of a plurality of different materials. For example, the substrate 20 can comprise a first substrate and a second substrate (not shown) that are bonded with each other. The material of the substrate 20 also comprises but is not limited to LiAlO$_2$, ZnO, GaP, glass, organic polymer, MN, GaAs, diamond, quartz, Si, SiC or diamond like carbon (DLC).

Next, a plurality of light-emitting units 22 which extends and arranges in a two-dimensional array is formed on the first surface of the substrate 20. The manufacturing method of the light-emitting diode array is described as below.

First, an epitaxy stack 220 is formed on a growth substrate (not shown) by conventional epitaxy process. The epitaxy stack 220 comprises a first semiconductor layer 221, an active layer 222, and a second semiconductor layer 223. The material of the growth substrate comprises but is not limited to GaAs, Ge, InP, sapphire, SiC, silicon, LiAlO$_2$, ZnO, GaN, or MN. The materials of the semiconductor layer 221, the active layer 222, and the second semiconductor layer 223 include one or more than one element selected form Ga, Al, In, As, P, N, Si or the group of the materials described above.

Then, as shown in FIG. 3B, a portion of the epitaxy stack is selectively removed by a photolithography process to form a plurality of epitaxy stacks 220 of the light-emitting units 22 that are separately arranged on the growth substrate. An exposed region of the first semiconductor layer 221 of each light-emitting unit 22 can further be formed by the photolithography process so that the exposed region serves as a platform for forming conductive connection structures later.

In order to increase light-extraction efficiency of the light-emitting diode array device, the epitaxy stack 220 of the light-emitting unit can be disposed on the substrate 20 by substrate transfer and substrate bonding. The epitaxy stack 220 of the light-emitting unit can be directly bonded with the substrate 20 by heating or pressuring. The epitaxy stack 220 of the light-emitting unit can also be adhered to the substrate 20 by a transparent adhesion layer (not shown). The transparent adhesion layer can be organic polymer transparent glue, such as polyimide, BCB, PFCB, Epoxy, Acrylic resin, PET, PC or combination thereof; or a transparent conductive oxide metal such as ITO, InO, SnO$_2$, ZnO, FTO, ATO, CTO, AZO, GZO or combination thereof; or an inorganic insulator, such as Al$_2$O$_3$, SiN$_x$, SiO$_2$, AlN, TiO$_2$, Ta$_2$O$_5$ or combination thereof.

In fact, the method of forming the epitaxy stack 220 of the light-emitting unit on the substrate 20 is not limited to these approaches. People having ordinary skill in the art can understand that the epitaxy stack 220 of the light-emitting unit can be directly epitaxial grown on the substrate 20 according to different characteristics of the structures. Besides, according to different times of transferring the substrate 20, the structure with the second semiconductor layer 223 near the first surface 201 of the substrate 20, the first semiconductor layer 221 on the second semiconductor layer 223, and the active layer sandwiched therein can be formed.

Next, an insulator 23 is disposed on a part of the surface of the epitaxy stack 220 and between adjacent epitaxy stacks 220 by CVD or PVD, etc. The insulator 23 protects the epitaxy stacks and electrically insulates the adjacent light-emitting units. The material of the insulator is preferably Al$_2$O$_3$, SiO$_2$, AlN, SiN$_x$, TiO$_2$, Ta$_2$O$_5$ or combination of the materials described above.

Then, a plurality of conductive connecting structures 29 which is totally separated with each other is formed on the surfaces of the first semiconductor layer 221 and the second semiconductor layer 223 of the two adjacent light-emitting units 22 by sputtering. In these totally separated conductive connecting structures 29, each of one end of the conductive connecting structure 29 is disposed on the first semiconductor layer 221 in single directional arrangement and directly contacts with the first semiconductor layer 221. The conductive connecting structures 29 electrically connect with each other via the first semiconductor layer 221. These conductive connecting structures that are separated with each other extend to the second semiconductor layer 223 of another adjacent light-emitting unit 22, and each of the other end electrically connects with the second semiconductor layer 223 to electrically connect two adjacent light-emitting units 22 in series.

In fact, the method of electrically connecting adjacent light-emitting units 22 is not limited to what is described above. People having ordinary skill in the art can understand that two ends of the conductive connecting structure are respectively disposed on the semiconductor layer with same polarity or different polarity of the different light-emitting units, so that the light-emitting units 22 can be electrically connected in series or in parallel.

Referring to the top view in FIG. 3B, in the light-emitting diode device 2 which has an electrical series arranged in an array, a first pad 26 is formed on the first semiconductor layer 221 of the first contact light-emitting unit B1 at the end of the array. In one embodiment, a second pad 28 can also be formed on the second semiconductor layer 223 of the second contact light-emitting unit B2 at the other end of the array. The light-emitting diode device 2 electrically connects to an external power or other circuits by wiring or soldering the first pad 26 and the second pad 28. The process of forming the first pad 26 and the second pad 28 can be performed in the same process of forming the conductive connecting structures 29. It also can be completed by several processes. The material of the first pad 26 and the second pad 28 can be the same as or different from that of the conductive connecting structures 29. In order to achieve a specific conductivity, the material of the first pad 26, the second pad 28, and the conductive connecting structures 29 is preferably metal, such as Au, Ag, Cu, Cr, Al, Pt, Ni, Ti, Sn, alloy or stacked composition of the materials described above.

In one embodiment, from the top view in FIG. 3B, the light-emitting units 22 of the light-emitting diode device 2 are electrically connected in series and arranged as an array. The light-emitting diode device 2 comprises four adjacent light-emitting rows R1-R4 and four adjacent columns C1-C4. In this embodiment, the light-emitting units 22 in the first light-emitting row R1 vertically connect with each other with a start at the second contact light-emitting unit B2, and horizontally connect to the second row and fourth column R2C4 from the first row and fourth column R1C4. Then, the light-emitting units 22 vertically connect in series from the second row and fourth column R2C4 to the second row and first column R2C1, and next, horizontally connect to the third row and first column R3C1. As shown in FIG. 3B, between the third and the fourth rows, the light-emitting units 22 alternately connect with the light-emitting units 22 in the adjacent row in vertical and in horizontal directions. For example, the third row and first column R3C1 horizontally connects to the fourth row and first column R4C1, and the fourth row and first column R4C1 vertically connects to the fourth row and second column R4C2, Next, the fourth row and second column R4C2 horizontally connects to the third row and second column R3C2, and the third row and second column R3C2 vertically connects to the third row and third column R3C3. Next, the third row and third column R3C3 horizontally connects to the fourth row and third column R4C3, and the fourth row and third column R4C3 vertically connect to the fourth row and fourth column R4C4. Finally, the fourth row and fourth column R4C4 horizontally connects to the third row and fourth column R3C4. The first pad 26 is formed on the first semiconductor layer 221 of the third row and fourth column R3C4 to form the first contact light-emitting unit B1.

In this embodiment, the connecting direction of at least three light-emitting units 22 in the first row is the same as that of at least three light-emitting units 22 in the second row. The connecting direction is vertical in this embodiment. The light-emitting units 22 in the third row and the fourth row connect with each other alternately in vertical and in horizontal so that the first contact light-emitting unit B1 and the second contact light-emitting unit B2 are not disposed on the diagonal of the light-emitting device 2.

Figure 3C:
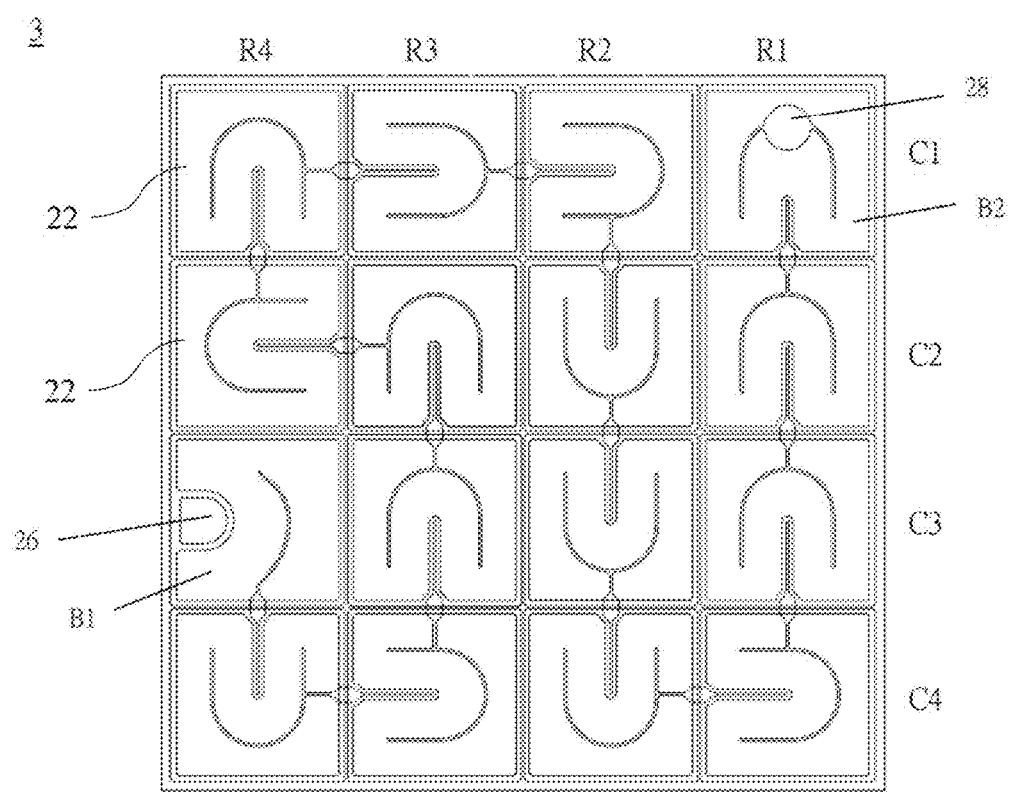

FIG. 3C shows a top view in accordance with the second embodiment of the present disclosure. In this embodiment, the light-emitting units 22 of the light-emitting device 3 electrically connect in series and arranged as an array. The light-emitting device 3 comprises four adjacent light-emitting unit rows R1-R4 and four adjacent light-emitting columns C1-C4. The manufacturing method and the material are the same as that of the first embodiment therefore will not be described herein.

In this embodiment, the connecting ways of the first row and the second row are the same as the first embodiment, that is, the light-emitting units 22 in the first light-emitting row R1 vertically connect with each other with a start at the second contact light-emitting unit B2. The connecting direction of at least three light-emitting units 22 in the first row is the same as that of at least three light-emitting units 22 in the second row. In this embodiment, the connecting direction is vertical.

Different from the first embodiment, in order to form the first contact light-emitting unit B1 in the fourth row in this embodiment, the electrical connection of the light-emitting units 22 in the third and the fourth rows has vertical connections in the third row and third column R3C3 and the third row and fourth column R3C4, and the other light-emitting units 22 in adjacent rows connect with each other in vertical and in horizontal alternately. The first pad 26 is formed on the first semiconductor layer 221 of the fourth row and third column R4C3 to form a first contact light-emitting unit B1. The first contact light-emitting unit B1 and the second contact light-emitting unit B2 are not disposed on the diagonal of the light-emitting device 3.

Figure 3D:
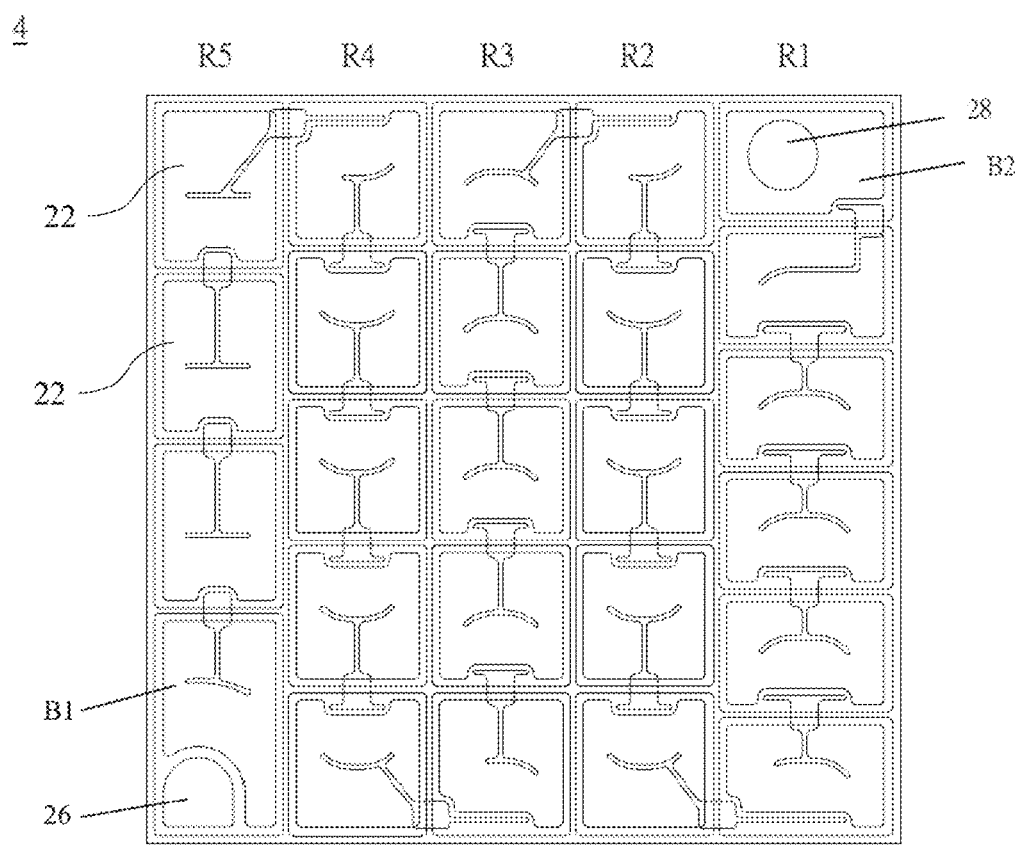

FIG. 3D shows a top view of the light-emitting diode device 4 in accordance with the third embodiment of the present disclosure. In this embodiment, the light-emitting units 22 of the light-emitting diode device 4 electrically connect in series and are arranged as an array. The light-emitting device 4 comprises five adjacent light-emitting unit rows R1-R5. The manufacturing method and the material are the same as that of the first embodiment therefore will not be described herein.

In this embodiment, the light-emitting units 22 connect with each other with a start at the second contact light-emitting unit B2 to the first contact light-emitting unit B1. The light-emitting units 22 in each light-emitting unit row R1-R5 vertically connect in series, and the last unit in each light-emitting unit row connects horizontally to the adjacent row. That is, the connecting direction of at least three light-emitting units 22 in each row is the same as that of at least three light-emitting units 22 in the adjacent row. In this embodiment, the connecting direction is vertical.

In this embodiment, each light-emitting unit 22 in the first light-emitting unit row R1 which comprises the second contact light-emitting unit B2 has a first area. Each light-emitting unit 22 in the second row to the fourth row R2-R4 which comprise light-emitting units 22 only has a second area. Each light-emitting unit 22 in the fifth light-emitting unit row R5 which comprises the first contact light-emitting unit B1 has a third area. The first area, the second area, and the third area are not equal.

In one embodiment, the difference ratio of any two of the first area, the second area, and the third area is less than 20%. In another embodiment, the first light-emitting unit row R1 which comprises the second contact light-emitting unit B2 has α light-emitting units. Each of the second row to the fourth row R2-R4 which comprise light-emitting units only has β light-emitting units. The fifth light-emitting unit row R5 which comprises the first contact light-emitting unit B1 has γ light-emitting units. The values of α, β and γ are not equal. In another embodiment, the first contact light-emitting unit B1 and the second contact light-emitting unit B2 are disposed on the diagonal of the light-emitting device 4.

Figure 3E:
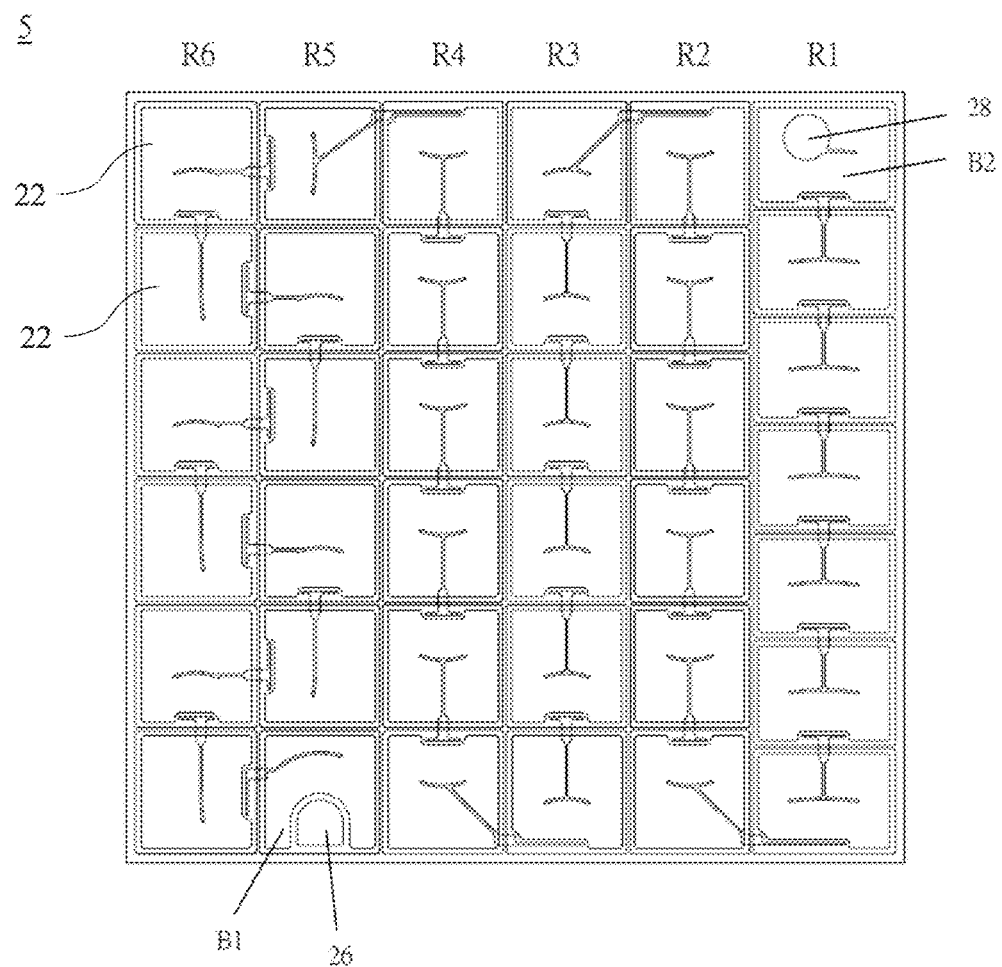

FIG. 3E shows a top view of the light-emitting diode device 5 in accordance with the fourth embodiment, which is also a variation of the first embodiment. In this embodiment, the light-emitting units 22 of the light-emitting diode device 5 electrically connect in series and are arranged as an array. The light-emitting device 5 comprises six adjacent light-emitting unit rows R1-R6. The manufacturing method and the material are the same as that of the first embodiment therefore will not be described herein.

In this embodiment, the connecting direction of at least three light-emitting units 22 in any of the first row to the fourth row is the same. The connecting direction is vertical in this embodiment. The light-emitting units 22 in the fifth row and the sixth row connect to the units in the adjacent rows alternately in vertical and in horizontal so that the first contact light-emitting unit B1 and the second contact light-emitting unit B2 are not disposed on the diagonal of the light-emitting device 5.

In this embodiment, the difference from the first embodiment is that the first light-emitting unit row R1 which comprises the second contact light-emitting unit B2 has α light-emitting units 22. Each of the second row to the fourth row R2-R4 and the sixth row R6 which comprise light-emitting units only has β light-emitting units 22. The fifth light-emitting unit row R5 which comprises the first contact light-emitting unit B1 has γ light-emitting units 22, wherein $\alpha \neq \beta = \gamma$.

Figure 3F:
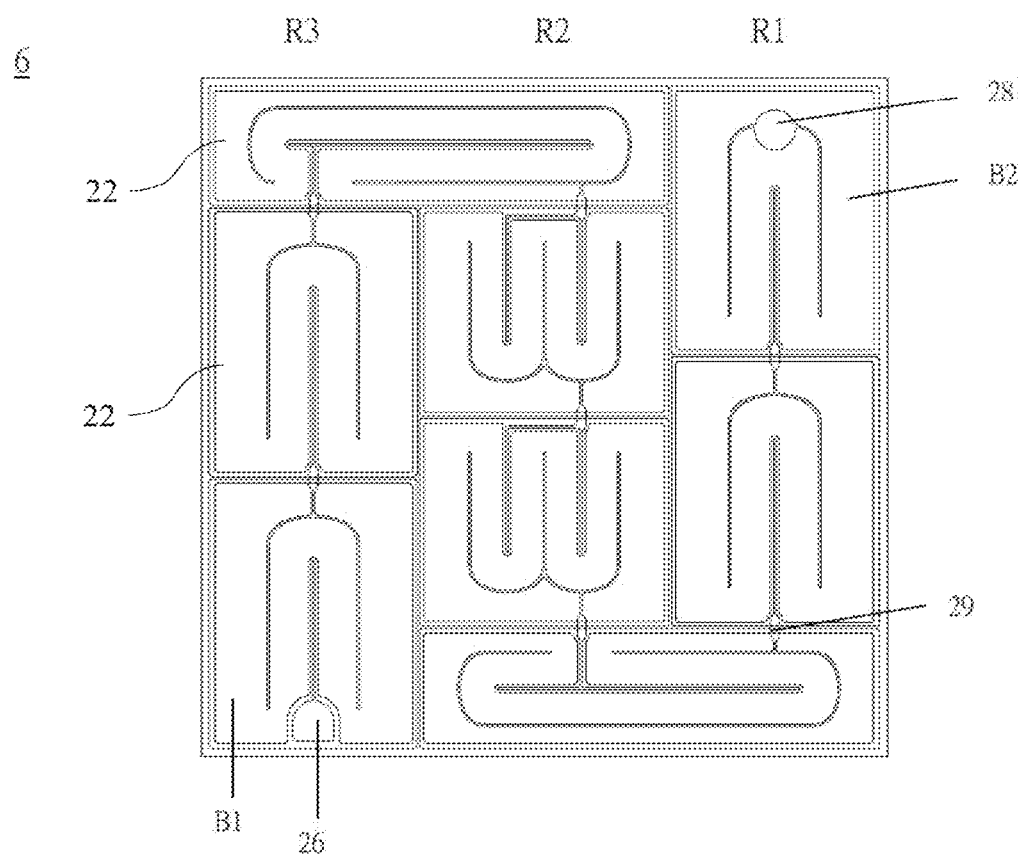

FIG. 3F shows a top view of the light-emitting diode device 6 in accordance with the fifth embodiment. In this embodiment, the light-emitting units 22 of the light-emitting diode device 6 electrically connect in series and are arranged as an array. The light-emitting device 6 comprises three adjacent light-emitting unit rows R1-R3. The manufacturing method and the material are the same as that of the first embodiment therefore will not be described herein.

In this embodiment, the connecting direction of at least three light-emitting units 22 in any of the first row to the third row is the same. The connecting direction is vertical in this embodiment. In this embodiment, the last unit in each row vertically connects to the unit in the adjacent row so that the first contact light-emitting unit B1 and the second contact light-emitting unit B2 are disposed on the diagonal of the light-emitting diode device 6.

In this embodiment, two conductive connection structures 29 of at least one light-emitting unit 22 in each row are formed on the same edge of the light-emitting unit, and simultaneously connect to two adjacent rows in vertical. In another embodiment, at least two light-emitting units 22 in each row have different area and/or different ratio of the length and the width.

Figure 3G:
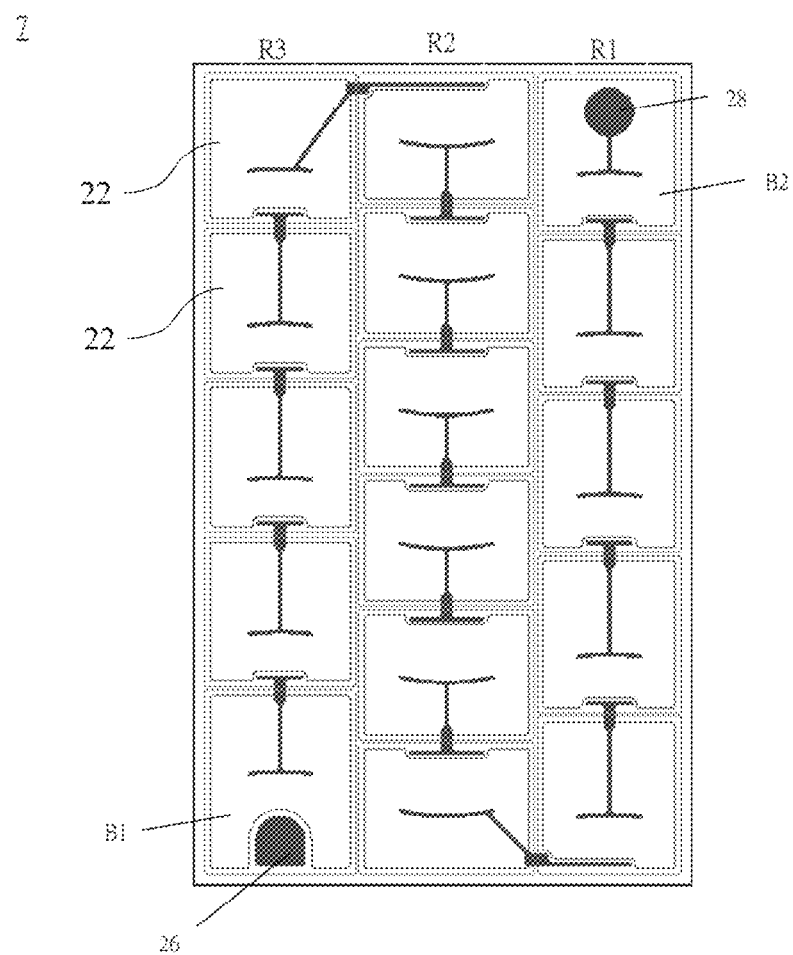

FIG. 3G shows a top view of the light-emitting diode device 7 in accordance with the sixth embodiment of the present disclosure. In this embodiment, the light-emitting units 22 of the light-emitting diode device 7 electrically connect in series and are arranged as an array. The light-emitting diode device 7 comprises three adjacent light-emitting unit rows R1-R3. The manufacturing method and the material are the same as that of the first embodiment therefore will not be described herein.

In this embodiment, at least three light-emitting units 22 in each row have a first area, and at least three light-emitting units 22 in the third row R3 have a second area. The first area and the second area are not equal.

Figure 4A:
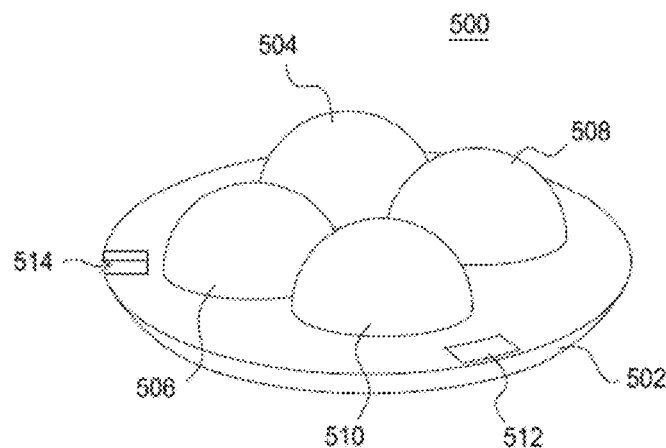
FIGS. 4A~4C show a light-emitting module including the light-emitting diode device in accordance with another embodiment of present disclosure.
Figure 4B:
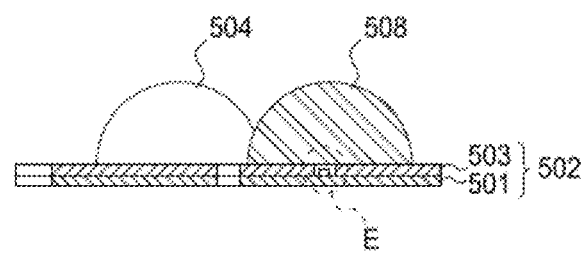
Figure 4C:
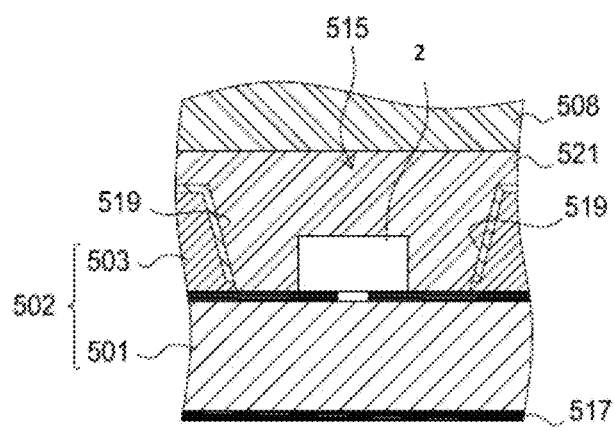

FIGS. 4A-4C show diagrams of a light-emitting module. FIG. 4A is a perspective view of the light-emitting module. The light-emitting module 500 comprises a carrier 502, a light-emitting device (not shown) in accordance with any embodiment of the present disclosure, a plurality of lenses 504/506/508/510, and two power supply terminals 512/514.

FIGS. 4B~4C show cross-sectional views of the light-emitting module. FIG. 4C is an enlarged view of a partial area E in FIG. 4B. The carrier 502 comprises an upper carrier 503 and a lower carrier 501. A surface of the lower carrier 501 contacts with the upper carrier 503 and the lens 504 and 508 are formed on the upper carrier 503. A through hole 515 is formed in the upper carrier 503. One of the light-emitting diode devices 2, 3, 4, 5 in accordance with the embodiments of present disclosure can be formed in the through hole 515, contacts with the lower carrier 501, and is covered by a glue 521. The lens 508 is formed on the glue 521.

In one embodiment, a reflector 519 can be formed on two sides of the through hole 515 to improve luminous efficiency of the light-emitting module 500. A metal layer 517 can be formed on lower surface of the lower carrier 510 to improve heat dissipating efficiency.

Figure 5A:
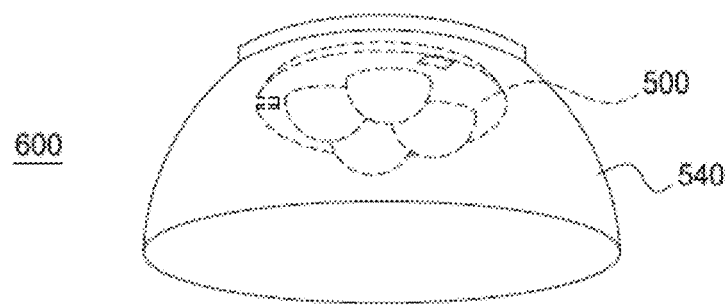
FIGS. 5A~5B show a light source generator including the light-emitting diode device in accordance with another embodiment of present disclosure.
Figure 5B:
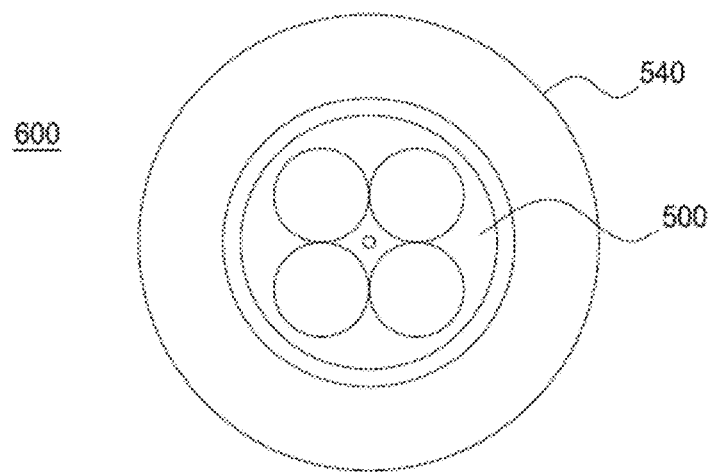

FIGS. 5A and 5B show a light source generator 600. The light generator 600 comprises a light-emitting module 500, a cover 540, a power supplier system (not shown) providing current to the light-emitting module 600, and a controller (not shown) controlling the power supplier system. The light source generator 600 can be a lighting device such as street lamp, headlight, or an interior lighting source, and it can also be a traffic light or a backlight source of a backlight module in a display.

Figure 6:
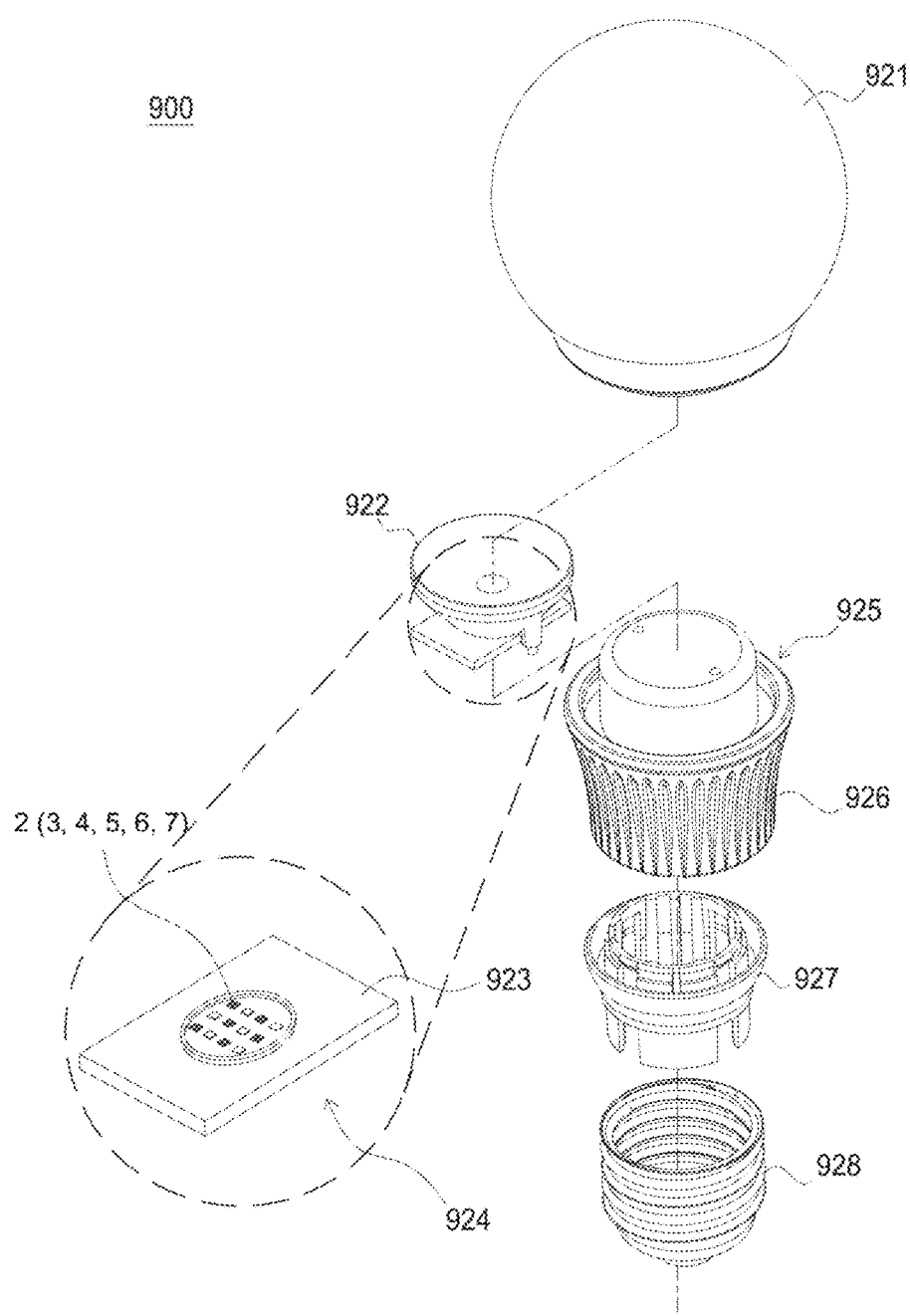
FIG. 6 shows a light bulb including the light-emitting diode device in accordance with another embodiment of present disclosure.

FIG. 6 shows a light bulb. The light bulb 900 comprises a cover 921, a lens 922, a lighting module 924, a supporter 924, a heat sink 926, a connector 927 and an electrical connector 928. The lighting module 924 comprises a carrier 923 and one of the light-emitting diode devices 2, 3, 4, 5, in accordance with any of the embodiments described above on the carrier 923.

In one embodiment of the present disclosure, a buffer layer (not shown) can be optionally formed between the first semiconductor layer 221 and the substrate 20. The buffer layer is between two material systems, and transits the material system of the substrate 20 to the semiconductor material system. For a structure of light-emitting diodes, the buffer layer reduces lattice-mismatch between two materials. The buffer layer can also serve as combination of two materials or two separated structures with single layer or multi-layer. The material of the buffer layer can be selected form organic material, inorganic material, metal or semiconductor. The structure of the buffer layer can be reflective layer, thermal conductive layer, electrical conductive layer, ohmic contact layer, anti-deformation layer, stress release layer, stress adjustment layer, bonding layer, wavelength conversion layer or mechanical fixing structure, etc.

A contact layer (not shown) is optionally formed on the epitaxy stack 220. The contact layer is formed on one side of the epitaxy stack 220 opposite to the substrate 20. Specifically, the contact layer is an optical layer, an electrical layer, or a combination thereof. The optical layer can change electromagnetic radiation or light which is generated form or enters the active layer 222. The word "change" means changing at least one optical characteristic of electromagnetic radiation or light, and the optical characteristic comprises but is not limited to frequency, wavelength, intensity, luminous flux, efficiency, color temperature, rendering index, light field and angle of view. The electrical layer can change at least one of the value, density or distribution of any of voltage, resistance, current, or capacitance between other layers and any side of the contact layer. The material of the contact layer comprises oxide, conductive oxide, transparent oxide, oxide with more than 50% transparency, metal, relative translucent metal, metal with more than 50% transparency, organic, inorganic, fluorescent, phosphorescent, ceramic, semiconductor, doped semiconductor, undoped semiconductor or any one of the described materials. In some applications, the material of the contact layer is ITO, ATO, CTO, ZTO, IZO, AZO or any one of the materials. The thickness of the relative translucent metal is preferably 0.005 μm~0.6 μm. In one embodiment, since the contact layer has a better lateral current spreading rate, it is helpful for uniform current spreading in the epitaxy stack 220. In general, the bandgap of the contact layer is between 0 eV to 5 eV and varies in accordance with different dopant and different process of the contact layer.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting diode device, comprising:
   a substrate, comprising a first surface;
   a plurality of light-emitting units formed on the first surface, wherein the light-emitting units form a serially-connected array, and the array comprises n adjacent light-emitting unit rows, wherein n≥5, and the light-emitting units in the same rows connect vertically and/or the light-emitting units in the same columns connect horizontally, and a connecting direction of at least three light-emitting units in two adjacent rows are the same;
   a plurality of conductive connecting structures connecting the plurality of light-emitting units;
   a first contact light-emitting unit formed on the first surface and in the first light-emitting unit row, and a first electrode pad formed on the first contact light-emitting unit; and
   a second contact light-emitting unit formed on the first surface and in the $n^{th}$ light-emitting unit row, and a second electrode pad formed on the second contact light-emitting unit;
   wherein at least three light-emitting units in the first light-emitting unit row have a first area, and at least three light-emitting units in the $n^{th}$ light-emitting unit row have a second area, wherein the first area and the second area are not equal.

2. The light-emitting diode device of claim 1, wherein the light-emitting units in the second light-emitting unit row to the $n-1^{th}$ light-emitting unit row have a third area, and the third area and the first and/or the second area are not equal.

3. The light-emitting diode device of claim 1, wherein a connection of the light-emitting units of one light-emitting unit row in at least two adjacent light-emitting unit rows and the light-emitting units in the adjacent light-emitting unit row comprises one vertical connection and two horizontal connection.

4. The light-emitting diode device of claim 1, wherein the deference between the first area and the second area is less than 20%.

5. The light-emitting diode device of claim 1, wherein the first light-emitting unit row has $\alpha$ light-emitting units, and the $n^{th}$ light-emitting unit row has $\beta$ light-emitting units, wherein $\alpha \neq \beta$.

6. The light-emitting diode device of claim 1, wherein the substrate is a growth substrate; the first contact light-emitting unit or the second contact light-emitting unit comprises:
   a first semiconductor layer;
   a second semiconductor layer formed on the first semiconductor layer; and
   an active layer formed between the first semiconductor layer and the second semiconductor layer.

7. The light-emitting diode device of claim 1, wherein the first contact light-emitting unit and the second contact light-emitting unit are not formed on a diagonal of the light-emitting diode device.

8. The light-emitting diode device of claim 1, wherein the first contact light-emitting unit and the second contact light-emitting unit are formed on a first side and a second side opposite to the first side of the light-emitting diode device respectively.

9. The light-emitting diode device of claim 1, wherein the first contact light-emitting unit and the second contact light-emitting unit are formed on a first side and a second side adjacent to the first side of the light-emitting diode device respectively.

* * * * *